(12) United States Patent
Loke et al.

(10) Patent No.: US 7,274,764 B2
(45) Date of Patent: Sep. 25, 2007

(54) PHASE DETECTOR SYSTEM WITH ASYNCHRONOUS OUTPUT OVERRIDE

(75) Inventors: Alvin Leng Sun Loke, Fort Collins, CO (US); Robert Keith Barnes, Fort Collins, CO (US); James Oliver Barnes, Fort Collins, CO (US)

(73) Assignee: Avago Technologies General IP (Singapore) Pte. Ltd, Singapore (SG)

( * ) Notice: Subject to any disclaimer, the term of this patent is extended or adjusted under 35 U.S.C. 154(b) by 761 days.

(21) Appl. No.: 10/718,206

(22) Filed: Nov. 20, 2003

(65) Prior Publication Data

US 2005/0111607 A1 May 26, 2005

(51) Int. Cl.
*H03D 3/24* (2006.01)
(52) U.S. Cl. ............... 375/373; 375/374; 375/376; 327/148; 327/157
(58) Field of Classification Search ............... 375/371, 375/373, 374–376; 327/142, 146, 147, 148, 327/155–158
See application file for complete search history.

(56) References Cited

U.S. PATENT DOCUMENTS

| | | | |
|---|---|---|---|
| 4,267,514 A | 5/1981 | Kimsey | |
| 4,270,093 A | 5/1981 | Miille | |
| 5,642,082 A * | 6/1997 | Jefferson | 331/25 |
| 5,994,934 A * | 11/1999 | Yoshimura et al. | 327/158 |
| 6,043,717 A * | 3/2000 | Kurd | 331/17 |
| 6,192,094 B1 | 2/2001 | Herrmann et al. | |
| 6,233,020 B1 | 5/2001 | Wilber | |
| 6,590,949 B1 | 7/2003 | Marten et al. | |
| 6,606,005 B2 | 8/2003 | Chang | |
| 7,084,682 B2 * | 8/2006 | Jeon et al. | 327/158 |

* cited by examiner

*Primary Examiner*—Dac V. Ha

(57) ABSTRACT

In one embodiment, the present invention provides a phase-locked loop comprising a charge-pump loop filter and a phase detector system. The charge-pump loop filter is configured to provide a control voltage having a voltage level based on a state of a first control signal and on a state of a second control signal. The phase detector system is configured to receive a first clock, a second clock, and a control signal defining a plurality of states including a first state and a second state. The phase detector system is further configured to provide the first control signal and the second control signal each having a state based on a phase difference between the first and second clocks when the control signal has the first state, and to provide the first control signal and second control signal each having a state asynchronously controlled by the control signal when the control signal has the second state.

17 Claims, 6 Drawing Sheets

| REFCLK 264 | DIVCLK 270 | ZCTRL 294 | UPCTRL 290 | DNCTRL 292 | UP 282 | DOWN 286 |
|---|---|---|---|---|---|---|
| ⊓⌴⊓ | ⊓⌴⊓ | 0 | 0 | 0 | NORMAL OPERATION | |
| DON'T CARE | DON'T CARE | 1 | DON'T CARE | DON'T CARE | 0 | 0 |
| DON'T CARE | DON'T CARE | 0 | 1 | 0 | 1 | 0 |
| DON'T CARE | DON'T CARE | 0 | 0 | 1 | 0 | 1 |
| DON'T CARE | DON'T CARE | 0 | 1 | 1 | 1 | 1 |

TRUTH TABLE

Fig. 3B

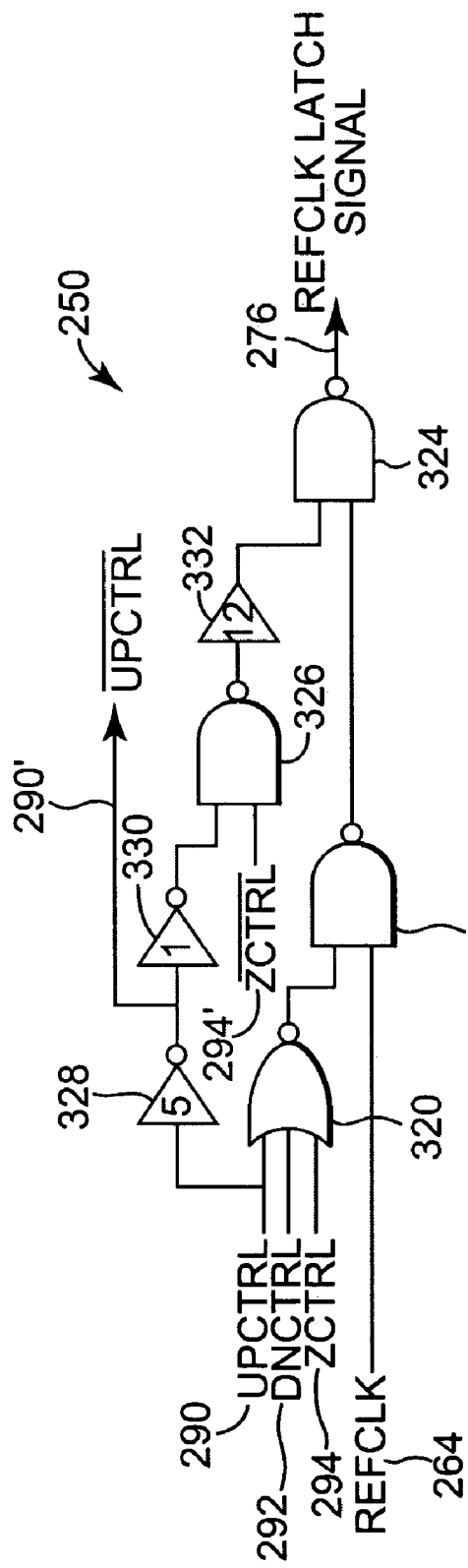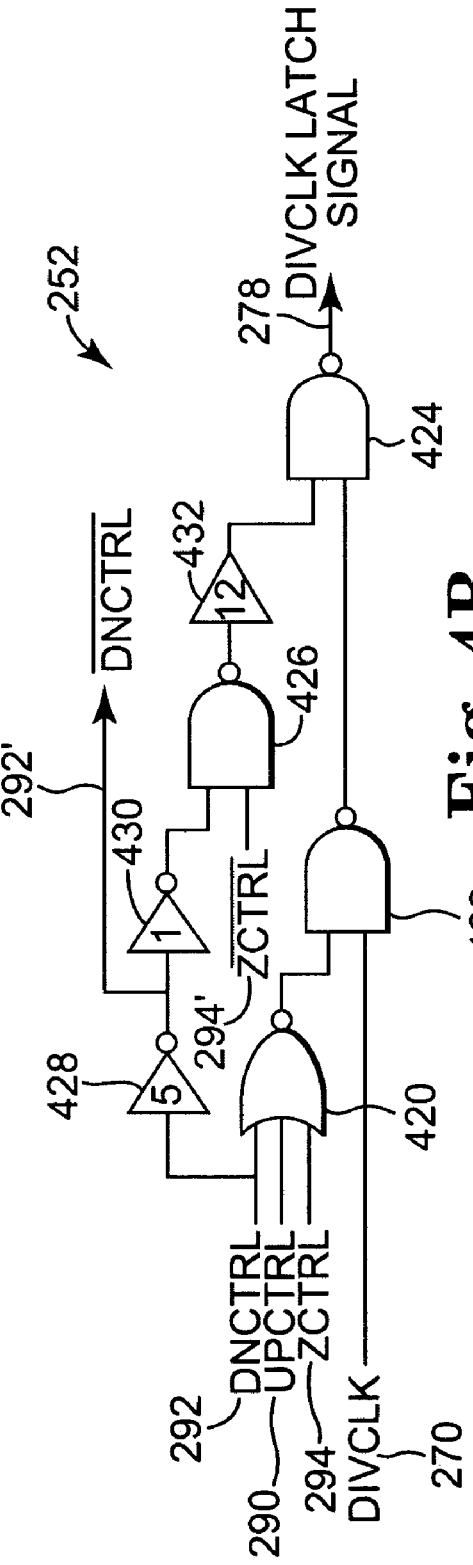
Fig. 4A
Fig. 4B

PHASE DETECTOR SYSTEM WITH
ASYNCHRONOUS OUTPUT OVERRIDE

BACKGROUND

A phase-locked loop (PLL) is a negative feedback loop where an output phase of a voltage-controlled oscillator (VCO) can be automatically synchronized ("locked") to a phase of a periodic input signal. The locking property of the PLL has numerous applications in communication systems such as frequency synthesis, frequency, amplitude, or phase modulation-demodulation, and clock and data recovery. A basic PLL has three components connected in a feedback loop: a VCO, a phase detector, and a loop filter, which is generally some type of low-pass filter. A basic PLL additionally includes a feedback frequency divider in applications where the VCO frequency is designed to be a multiple of a frequency of the input reference clock.

The VCO is an oscillator whose frequency is monotonically modulated by an input voltage. The voltage at the input of the VCO determines the frequency of a periodic signal at the output of the VCO. While the frequency of the VCO can be designed to decrease in response to an increase in the voltage input, voltage-controlled oscillators are typically designed so as to increase frequency in response to an increasing input voltage.

The output of the VCO and a periodic input signal are inputs to the phase detector. The period input signal is generally referred to as an input reference clock. The phase detector produces an output voltage signal proportional to the phase difference between the input reference clock and the VCO output signal. The output of the phase detector is filtered by the low-pass loop filter. The loop is closed by connecting the loop filter output to the input of the VCO, such that the loop filter output voltage controls the frequency of the VCO. When the loop is "locked", the phase and frequency of the VCO output are substantially equal to the phase and frequency of the input reference clock.

For PLL's with low jitter requirements, such as those utilized in high-speed serial data transmission, both coarse and fine control of the VCO are typically required, as a single line control is generally not sufficient. Coarse control provides the tuning range necessary for the PLL to lock to its input reference clock amidst process, power supply voltage, and temperature (PVT) fluctuations; uncertainties in circuit modeling during the design process, and flexibility to adjust the input reference frequency for system test purposes. Fine control, with its smaller effect on the VCO output, allows the PLL to track small perturbations in input and voltage-temperature conditions during normal operation while providing high immunity against circuit noise that principally dictate jitter performance.

One conventional low-jitter PLL configured as a frequency synthesizer employs a charge-pump loop filter providing the fine control voltage input to a varactor-tuned VCO, wherein the charge-pump loop filter is driven by a sequential phase-frequency detector (PFD). One conventional sequential PFD, commonly referred to as cross-coupled quad-NOR gate detector, suffers from an inherent jitter-causing glitch occurring when a rising clock edge occurs while an associate reset signal is asserted. In another basic implementation, the sequential PFD consists of two positive edge-triggered D (delay) latches and a logical AND-gate. The first latch senses rising edges in an input reference clock (REFCLK) and the second rising edges in a feedback clock (FDBCLK) in respectively generating UP and DOWN outputs which serve as control inputs to the charge-pump loop filter. When both the UP and DOWN inputs are asserted. HI, the AND-gate generates a RESET signal that clears both latch outputs concurrently, thereby resetting the PFD for the next phase comparison.

The resulting UP and DOWN outputs are pulses having different pulse widths, where the wider pulse is wider than the narrower pulse by the phase difference between the REFCLK and the FDBCLK. The wider pulse also corresponds to the clock having the earlier rising edge. The width of the narrower pulse is determined by propagation delays in the AND-gate and associated reset circuitry. When the REFCLK has a higher frequency than the FDBCLK, the UP pulse is wider, resulting in the charge-pump loop filter raising its output voltage and the corresponding VCO increasing the frequency of FDBCLK. When the FDBCLK has a higher frequency than REFCLK, the DOWN pulse is wider, resulting in the charge-pump loop filter lowering its output voltage and the corresponding VCO decreasing the frequency of FDBCLK.

The above describes the normal operation of the PLL. However, in a PLL employing coarse and fine control of a varactor-tuned VCO, a self-calibration procedure is invoked prior to normal operation. Employing both coarse and fine control desensitizes the PLL from circuit noise affecting the control voltage. Self-calibration refers to a process for determining a level of the coarse control voltage input that will set the VCO in the correct frequency range ("capture range") so that the PLL can track the input reference clock using only the fine control voltage input. Ideally, the self-calibration procedure is performed with the PLL in an "open-loop" configuration, with the charge-pump output held at a constant value. The coarse control input is then "swept" across a voltage range to find a voltage level that will cause the VCO to generate a frequency that is within the PLL's frequency capture range. By doing so, the PLL should be able to track input perturbations using only fine control.

One calibration method involves positioning a switch in the fine control voltage path between the charge-pump loop filter and the VCO. The switch is opened during the self-calibration procedure to achieve the open-loop condition and to isolate the VCO from the charge-pump output. However, during normal operation, the switch adds resistance to the loop and negatively impacts loop performance and response.

One feature beneficial for a PLL is that it be testable. The functionality of PLL components can be verified by observing the VCO output for a given set of "forced" phase-frequency detector outputs. Controlling the PFD outputs can also aid in isolating faulty components in the loop. It is possible to incorporate testability in the sequential PFD by replacing the edge-triggered D-latches described above with corresponding scan latches whose outputs can be overridden with external scan chain data. However, this technique, commonly employed in read-write functionality testing of registers, cannot be applied in a PLL because the PFD must not only operate in its override mode during scan testing mode, but also during PLL self-calibration.

SUMMARY

In one embodiment, the present invention provides a phase-locked loop comprising a charge-pump loop filter and a phase detector system. The charge-pump loop filter is configured to provide a control voltage having a voltage level based on a state of a first control signal and on a state of a second control signal. The phase detector system is configured to receive a first clock, a second clock, and a control signal defining a plurality of states including a first state and a second state. The phase detector system is further configured to provide the first control signal and the second control signal each having a state based on a phase difference between the first and second clocks when the control signal has the first state, and to provide the first control signal and second control signal each having a state asynchronously controlled by the control signal when the control signal has the second state.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 3B is a truth table summarizing an exemplary response of the phase detector of FIG. 3A.

FIG. 4A is a schematic diagram illustrating one exemplary embodiment of an reference clock control circuit according to the present invention.

FIG. 4B is a schematic diagram illustrating one exemplary embodiment of a divided clock control circuit according to the present invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Figure 1:
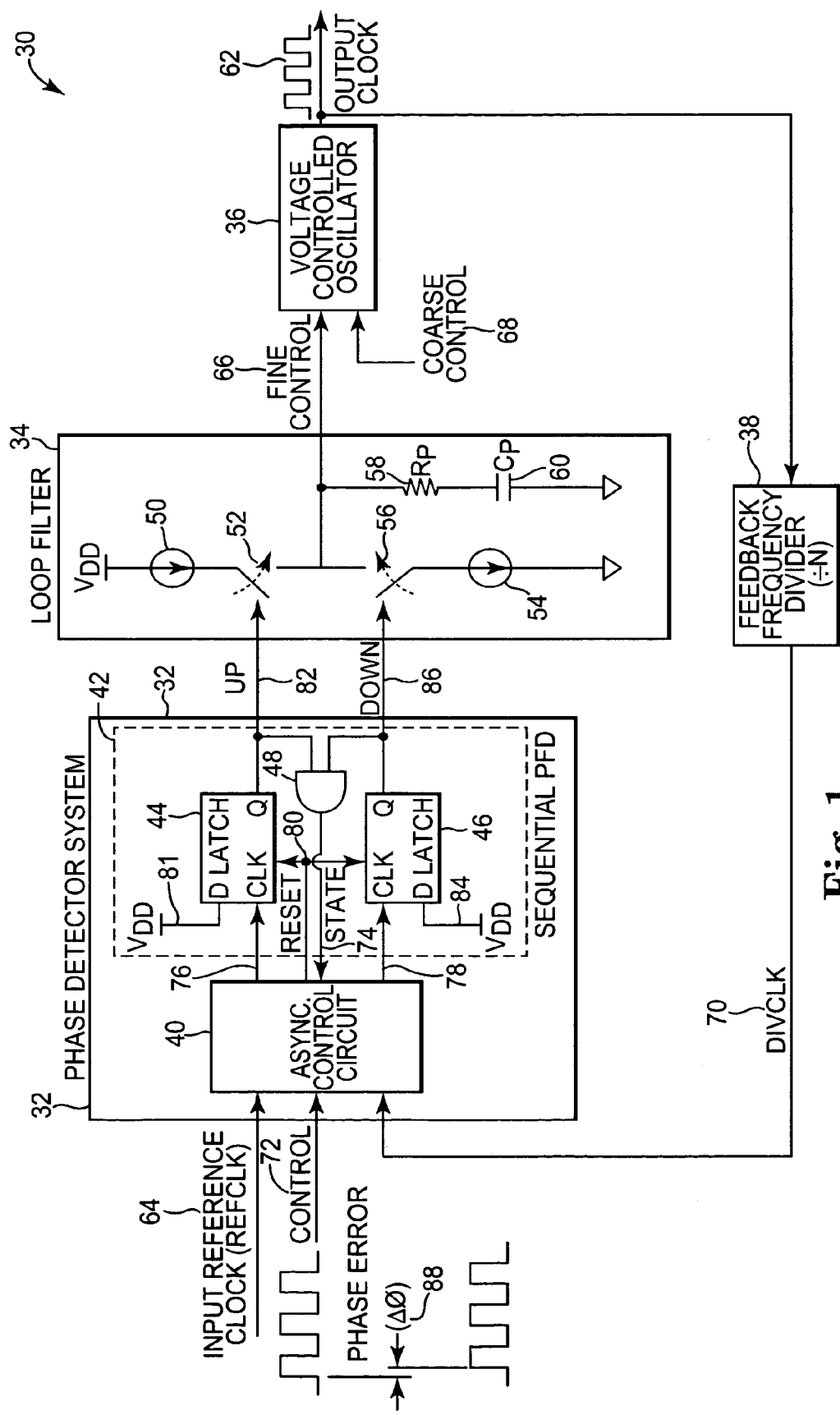
FIG. 1 is a block and schematic diagram illustrating one exemplary embodiment of a charge-pump phase-locked loop employing a phase-frequency system according to the present invention.

FIG. 1 is a block and schematic diagram of a charge-pump phase lock loop 30 employing a phase detector system 32 according to the present invention. PLL 30 further includes a charge-pump loop filter 34, a voltage controlled oscillator (VCO) 36, and a feedback frequency divider 38. Phase detector system 32 further includes an asynchronous clock control circuit 40 and a sequential phase-frequency detector (PFD) 42, with sequential PFD 42 further comprising a reference latch 44, a feedback latch 46, and an AND-gate 48. In one embodiment, as illustrated, both reference latch 44 and feedback latch 46 are positive edge-triggered D-latches (delay latches). Charge-pump loop filter 34 further includes a first current source 50 and associated first switch 52, a second current source 54 and associated switch 56, and a series-connected resistor 58 and capacitor 60.

As illustrated, PLL 30 is configured as a clock multiplier. As such, VCO 36 is configured to provide an output clock 62 having a frequency substantially equal to a multiple (N) of the frequency of an input reference clock (REFCLK) 64, wherein the frequency of output clock 62 is based on a voltage level of a fine control signal 66 provided by charge-pump loop 34, and voltage level of a coarse control signal 68. Feedback frequency divider divides output clock 62 by N to provide a divided clock (DIVCLK) 70 having a frequency substantially equal to the frequency of output clock 62 divided by N.

Asynchronous clock circuit (ACC) 40 receives REFCLK 64, DIVCLK 70, a control signal 72, and a latch state signal 74 from the output of AND-gate 48. ACC 40 provides a REFCLK latch signal at 76 to the clock input (CLK) of reference latch 44, a DIVCLK latch signal at 78 to the clock input (CLK) of feedback latch 46, and a reset signal (RESET) 80 to both reference latch 44 and feedback latch 46, wherein a state of the REFCLK latch signal and a state of the DIVCLK latch signal is based on a state of control signal 72.

Reference latch 44 is coupled to a supply voltage (VDD) at its "D" input as indicated at 81, and provides a first switch control signal via its Q output to first switch 52 via a path 82, wherein a state of the first switch control signal is based on a state of the REFCLK latch signal at 76. Feedback latch 46 is coupled to VDD at its "D" input as indicated at 84, and provides a second switch control signal via its Q output to second switch 56 via a path 86, wherein a state of the second switch control signal is based on a state of the DIVCLK latch signal at 78. The first and second switch control signals provided respectively at the Q outputs of reference latch 44 and feedback latch 46 are hereinafter referred to as the UP and DOWN signals, as indicated by FIG. 1. Charge-pump loop filter 34 is configured to provide fine control signal 66 to VCO 36 and to adjust the voltage level of fine control signal 66 based on the states of the UP and DOWN signals 82 and 86.

Phase detector system 32 is configured to provide UP and DOWN signals 82 and 86 based on control signal 72, wherein control signal 72 defines a plurality of states, including a first state and a second state. In one embodiment, when control signal 72 has the first state, asynchronous clock control circuit 40 functions as a pass-through circuit and provides REFCLK 64 as the REFCLK latch signal at 76 to the CLK input of reference latch 44, and provides DIVCLK 70 as the DIVCLK latch signal at 78 to the CLK input of feedback latch 46. Sequential PFD 42 then provides UP and DOWN signals 82 and 86 having states based on a phase difference ($\Delta\phi$) 88 between REFCLK 64 and DIVCLK 70. In essence, phase detector system 32 functions as a conventional phase-frequency detector when control signal 72 has the first state, or "normal" operation state. The operation of PLL 30 during normal operation is further discussed by FIG. 2 below. In one embodiment, when control signal 72 has the second state, phase detector system 32 asynchronously controls the states of UP and DOWN signals 82 and 86 based on control signal 72 independently of the states or phase difference 88 between REFCLK 64 and DIVCLK 70.

By asynchronously controlling the states of UP and DOWN signals 82 and 86, phase detector system 32, in response to control signal 72, can simultaneously force UP and DOWN signals 82 and 86 to a "low" condition. This condition disables charge-pump loop filter 34 from responding to phase errors 88 between REFCLK 64 and DIVCLK 70, thus leaving the voltage level of fine control signal 66 unchanged over time and enabling self-calibration of VCO 36 without the use of a resistance-introducing switch between VCO 36 and loop filter 34. Additionally, phase detector system 32, in response to control signal 72, can individually or simultaneously force the states of UP and DOWN signals 82 and 86 to a "high" condition, thereby enabling system testing of PLL 30. Such design-for-testability (DFT) enables PLL 30 to be more easily tested during manufacture, thereby decreasing the number of required design iterations and lowering design and production costs.

Figure 2:
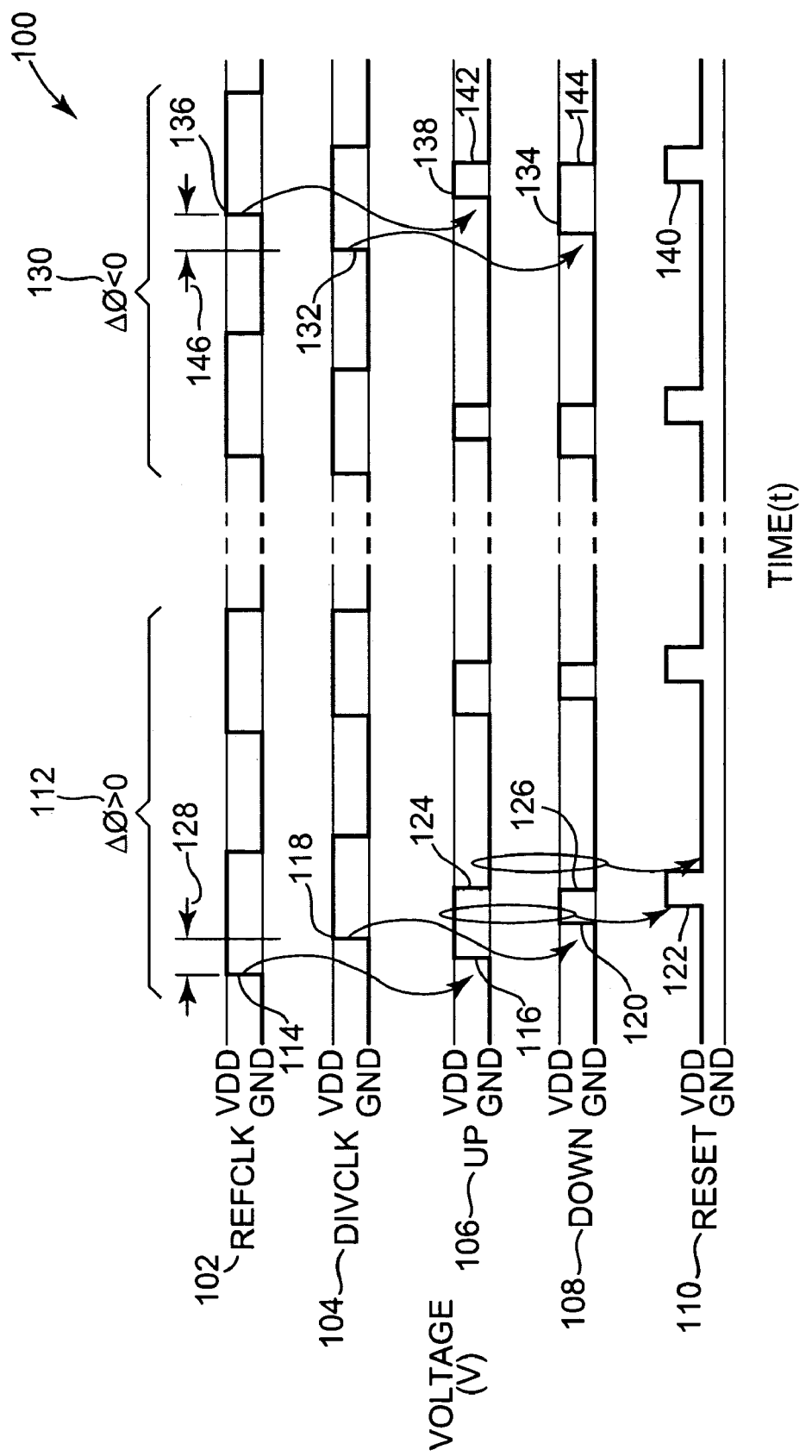
FIG. 2 is a timing diagram illustrating an example operation of the phase detector system of FIG. 1.

FIG. 2 is a timing diagram 100 illustrating an example operation of PLL 30 of FIG. 1 during normal operation when control signal 72 has the first state and asynchronous clock control circuit 40 is operating as a pass-through circuit. Time (t) and Voltage (V) are indicated by the x- and y-axes, respectively. Waveforms representative of REFCLK 64, DIVCLK 70, UP signal 82, DOWN signal 86, and RESET signal 80 are respectively indicated at 102, 104, 106, 108, and 110.

A first portion 112 of timing diagram 100 illustrates the operation of PLL 30 when the phase of REFCLK 64 leads, or is greater than, the phase of DIVCLK 70. When a rising edge 114 of REFCLK 64 is detected at 76 by the CLK input of reference latch 44, UP signal 82 at the Q output is set from ground (GND) to supply voltage $V_{DD}$ as indicated at 116. This causes first switch 52 to close and current from first current source 50 to flow through resistor 58 and capacitor 60, thereby adding charge to capacitor 60 and causing the voltage level of fine control signal 66 to increase and VCO 36 to correspondingly increase the frequency of the output clock 62.

When a rising edge 118 of DIVCLK 70 is detected at 78 by the CLK input of feedback latch 46, DN signal 86 at the Q output is set from GND to $V_{DD}$ as indicated at 120. This causes second switch 56 to close and current from second current source 54 to flow to ground. In an ideal situation, the current provided by current sources 50 and 54 are equal. Thus, the current from first current source 50 is "drained away" by second current source 54 and charge is no longer added to capacitor 60, thereby "stabilizing" the frequency of output clock 62.

With both the UP and DOWN signals 82 and 86 at $V_{DD}$, the latch state signal 74 at the output of AND-gate 48 is set "high", which in-turn sets RESET 80 from GND to $V_{DD}$ as indicated at 122. With RESET 80 at $V_{DD}$, reference latch 44 and feedback latch 46 respectively reset UP signal 82 and DOWN signal 86 at their Q outputs to GND, as indicated at 124 and 126. The width of the pulse of UP signal 82 exceeds the width of the pulse of DOWN signal 86 by the phase difference 88 between REFCLK 64 and DIVCLK 70, as indicated at 128.

A second portion 130 of timing diagram 100 illustrates the operation of PLL 30 when the phase of REFCLK 64 lags, or is less than, the phase of DIVCLK 70. When a rising edge 132 of DIVCLK 70 is detected at 78 by the CLK input of feedback latch 46, DOWN signal 86 at the Q output is set from GND to $V_{DD}$ as indicated at 134. This causes second switch 56 to close and current from second current source 54 to flow to ground, thereby draining charge from capacitor 60 and causing the voltage level of fine control signal 66 to decrease and VCO 36 to correspondingly decrease the frequency of output clock 62.

When a rising edge 136 of REFCLK is detected at 76 by the CLK input of reference latch 44, UP signal 82 at the Q output is set from GND to $V_{DD}$ as indicated at 138. This causes first switch 52 to close and couple first current source 50 to resistor 58. The current provided by first current source 50 offsets the current drained away by second current source 54 and charge is no longer drained from capacitor 60, thereby stabilizing the frequency of output clock 62.

With both the UP and DOWN signal 82 and 86 at $V_{DD}$, the latch state signal 74 at the output of AND-gate 48 is set "high", which in-turn sets RESET 80 from GND to $V_{DD}$ as indicated at 140. With RESET 80 at $V_{DD}$, reference latch 44 and feedback latch 46 respectively reset UP signal 82 and DOWN signal 86 at their Q outputs to GND, as indicated at 142 and 144. The width of the pulse of DOWN signal 86 exceeds the width of the pulse of UP signal 82 by the phase difference 88 between REFCLK 64 and DIVCLK 70, as indicated at 146.

As illustrated by first and second portions 112 and 130 of timing diagram 100, the wider pulse between the UP signal 82 and the DOWN signal 86 is wider than the narrower pulse by the phase difference 88 between REFCLK 64 and DIVCLK 70. Additionally, the wider pulse corresponds to the earlier, or leading clock, of the two clocks REFCLK 64 and DIVCLK 70. The width of the narrower pulse is determined by propagation delays in AND-gate 48 and latch reset response of reference latch 44 and feedback latch 46.

Figure 3A:
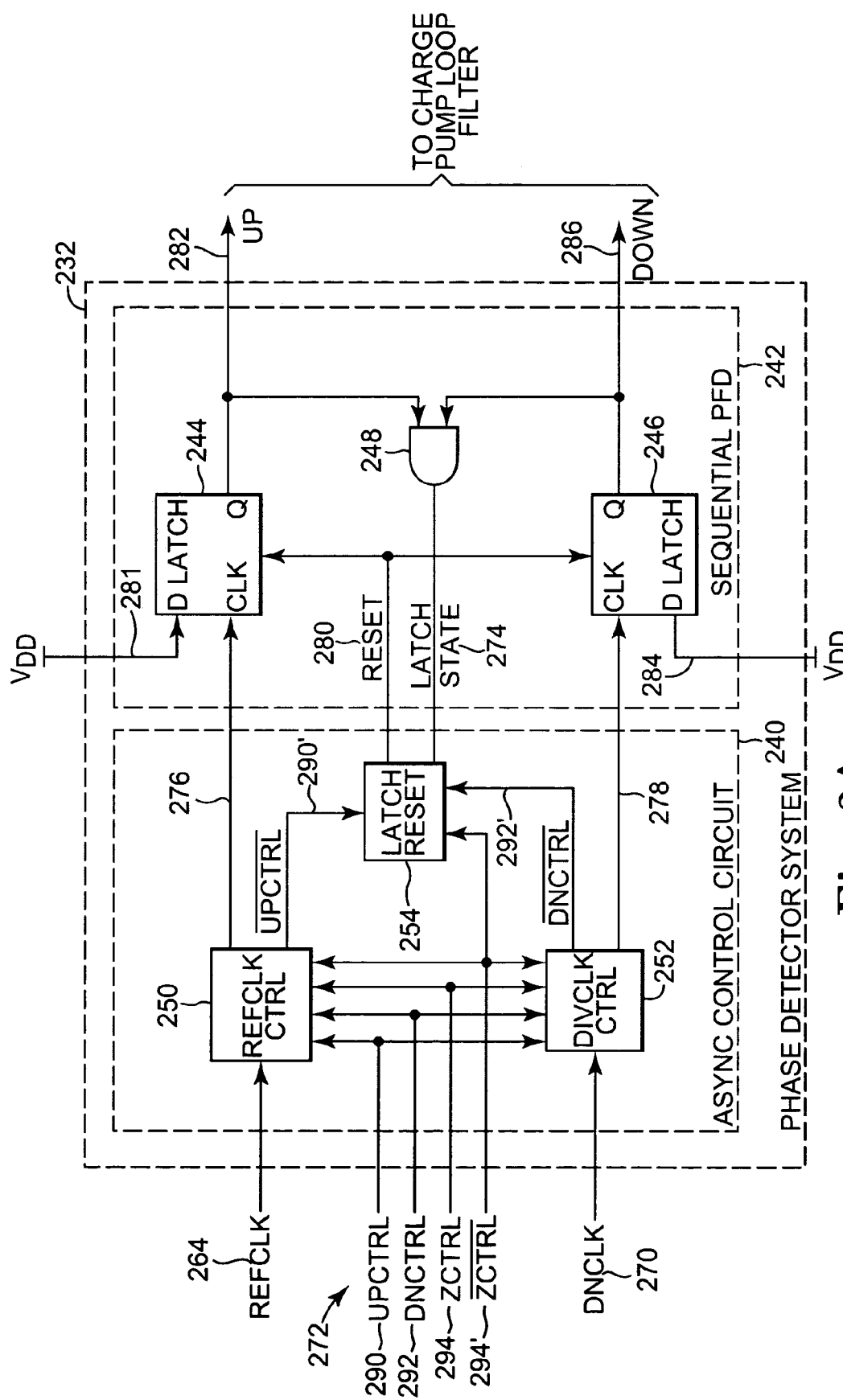
FIG. 3A is a block and schematic diagram illustrating one exemplary embodiment of a phase detector system according to the present invention.

FIG. 3A is a block and schematic diagram illustrating one exemplary embodiment of a phase detector system 232 according to the present invention. Phase detector system 232 includes an asynchronous clock control circuit 240 and a sequential phase-frequency detector (PFD) 242. Sequential PFD 242 further includes a reference clock latch 244, a feedback latch 246, and an AND-gate 248, with both reference latch 244 and feedback latch 246 comprising positive edge-triggered D-latches.

Asynchronous clock control circuit (ACC) 240 further includes a reference clock (REFCLK) control circuit 250, a divided clock (DIVCLK) control circuit 252, and a latch reset control circuit 254. ACC 240 receives a reference clock (REFCLK) 264, a divided feedback clock (DIVCLK) 270, a clock control signal 272, and a latch state signal 274 from the output of AND-gate 248. As illustrated, clock control signal 272 comprises an "up" control signal (UPCTRL) 290, a "down" control signal (DNCTRL) 292, a calibration control signal (ZCTRL) 294, and the inverse of ZCTRL 294, indicated as $\overline{ZCTRL}$ 294', each signal having a "HI" and a "LOW" state. In one embodiment, the HI and LO states correspond respectively to a values of "1" and "0". While illustrated in FIG. 3 as comprising three control inputs 290, 292, and 294, clock control signal 272 may comprise a number of control signals other than three.

REFCLK control circuit 250 and DIVCLK control circuit 252 each receive UPCTRL signal 290, DNCTRL signal 292, ZCTRL signal 294 and its inverse $\overline{ZCTRL}$ 294'. REFCLK control circuit 250 provides a REFCLK latch signal at 276 to the CLK input of reference latch 244, and the inverse of UPCTRL signal 290 to latch reset control circuit 254, which is indicated as $\overline{UPCTRL}$ 290'. DIVCLK control circuit 252 provides a DIVCLK latch signal at 278 to the CLK input of feedback latch 246, and the inverse of DNCTRL signal 292 to latch reset control circuit 254, which is indicated as $\overline{DNCTRL}$ 292'. Latch reset control circuit 254 also receives latch state signal 274 from AND-gate 248 and provides a RESET signal at 280 to both reference latch 244 and feedback latch 246.

Reference latch 244 is coupled to a supply voltage (VDD) at its D input as indicated at 281, and provides via its Q output an UP signal 282 having a state based on REFCLK latch signal at 276. Feedback latch 246 is coupled to VDD at its D input as indicated at 284, and provides via its Q output a DN signal 286 having a state based on DIVCLK latch signal at 278.

When ZCTRL 294 is asserted HI, REFCLK control circuit 250 blocks REFCLK 264 from reaching reference latch 244, and DIVCLK control circuit 252 blocks DIVCLK 270 from feedback reaching latch 246, regardless of the states of UPCTRL signal 290 and DNCTRL signal 292. Latch reset control circuit 254 provides RESET signal 280 at a HI state to deactivate UP signal 282 provided by reference latch 244 and DOWN signal 286 provided by feedback latch 246. This condition disables an associated charge-pump loop filter, such as charge-pump loop filter 34, from updating the voltage level of fine control signal 66 to VCO 36, thus leaving fine control signal 66 substantially unchanged over time. This condition enables calibration of an associated voltage-controlled oscillator, such as VCO 36, without use of a resistance introducing switch between VCO 36 and charge-pump loop filter 34.

When ZCTRL 294 is asserted LO, the operation of phase detector system 232 depends on the states of UPCTRL 290 and DNCRTL 292. If UPCTRL 290 and DNCTRL 292 are also asserted LO, REFCLK control circuit 250 and DIVCLK control circuit 252 function as pass-through circuits and respectively provide REFCLK 264 as REFCLK latch signal 276 and DIVCLK 270 as DIVCLK latch signal 278. In this case, phase detector system 232 functions as a conventional phase frequency detector and operates in a fashion similar to phase detector system 32 as described above by FIG. 1.

When UPCTRL 290 is asserted HI and DNCTRL 292 is asserted LO, REFCLK control circuit 250 blocks REFCLK 264 and provides REFCLK latch signal 276 at a HI state, and DIVCLK 252 blocks DIVCLK 270 and provides DIVCLK latch signal 278 at a LO state. In response, reference latch 244 provides UP signal 282 at a HI state and feedback latch 246 provides DOWN signal 286 at a LO state. This condition causes the voltage level of a fine control signal, such as fine control signal 66, to drift toward the supply voltage $V_{DD}$, and the frequency of output clock 62 should increase over time, assuming that the frequency of VCO 36 increases in response to an increase in the control voltage.

When UPCTRL 290 is asserted LO and DNCTRL 292 is asserted HI, REFCLK control circuit 250 blocks REFCLK 264 and provides REFCLK latch signal 276 at a LO state, and DIVCLK control circuit 252 blocks DIVCLK 270 and provide DIVCLK latch signal 278 at a HI state. In response, reference latch 244 provides UP signal 282 at a LO state, and feedback latch 246 provides DOWN signal 286 at a HI state. This condition causes the voltage level of a fine control signal, such as fine control signal 66, to drift toward ground, and the frequency of output clock 62 should decrease over time.

When both UPCTRL 290 and DNCTRL 292 are asserted HI, REFCLK control circuit 250 blocks REFCLK 264 and provides REFCLK latch signal 276 at a HI state, and DIVCLK control circuit 252 blocks DIVCLK 270 and provides DIVCLK latch signal 278 at a HI state. In response, reference latch 244 provides UP signal 282 at a HI state, and feedback latch 246 provides DOWN signal 286 at a HI state. This condition activates both current sources of an associated charge pump loop filter, such as first and second current sources 50 and 54, and any mismatch in the two current sources can be detected by observing any drift in the frequency of output clock 62 over time. If the frequency increases, first current source 50 is providing more current than second current source 54. Conversely, if the frequency decreases, first current source 50 is providing less current than second current source 54.

FIG. 3B is a truth table 300 summarizing the response of phase detector system 232 to various states of clock control signal 272 as described above by FIG. 3A. Row 302 indicates the states of the various signals when ZCTRL 294 is asserted HI. REFCLK 264, DIVCLK 270, UPCTRL 290 and DNCTRL 292 are all blocked, and thus, their states are irrelevant. When ZCTRL 294 is asserted LO, REFCLK 264 and DIVCLK 270 are blocked, and the states of UP signal 282 and DOWN signal 286 respectively follow the states of UPCTRL 290 and DNCTRL 292, as indicated by rows 304, 306, and 308. However, when the states of UPCTRL 290 and DNCTRL 292 are both LO, as indicated by row 310, phase detector system 232 is operating as a conventional sequential PFD, and the states of UP signal 282 and DOWN signal 286 are based on a phase difference between REFCLK 264 and DIVCLK 270.

Based on truth table 300 of FIG. 3B, desired control logic for REFCLK control circuit 250, DIVCLK control circuit 252, and latch reset control circuit 254 can be respectively described by Boolean Equations I, II, and III below:

$$REFCLK \text{ latchsignal } 276 = REFCLK\ 264 * \overline{ZCTRL}\ 294 * (\overline{UPCTRL}\ 290' * \overline{DNCTRL}\ 292' + UPCTRL\ 290) \quad \text{Equation I:}$$

$$DIVCLK \text{ latch signal } 278 = DIVCLK\ 270 * \overline{ZCTRL}\ 294 * (\overline{DNCTRL}\ 292' * \overline{UPCTRL}\ 290' + DNCTRL\ 292) \quad \text{Equation II:}$$

$$RESET = (UP \text{ signal } 282 * DOWN \text{ signal } 286) * \overline{UPCTRL}\ 290' * \overline{DNCTRL}\ 292' + ZCTRL\ 294 \quad \text{Equation III:}$$

where "*" and "+" denote the logical AND and OR functions respectively.

Figure 4C:
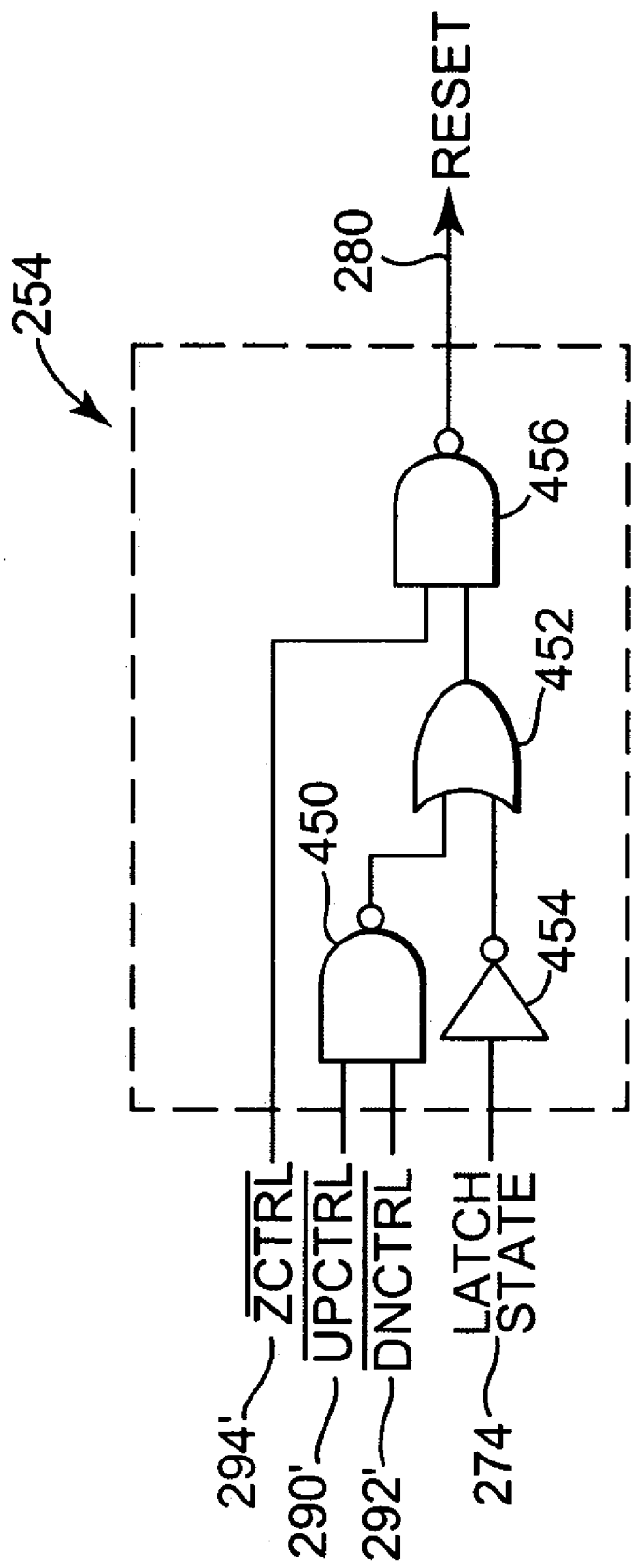
FIG. 4C is a schematic diagram illustrating one exemplary embodiment of a latch reset control circuit according to the present invention.

FIGS. 4A through 4C described below are example logic implementations of REFCLK control circuit 250, DIVCLK control circuit 252, and latch reset control circuit 254 based on the above equations. Other logic implementations are possible for these control circuits as well. However, the implementations illustrated in FIGS. 4A through 4C attempt to minimize propagation delay of the active control signals through the control logic during normal operation (see row 310 of truth table 300).

FIG. 4A is a schematic diagram illustrating one exemplary embodiment of REFCLK control circuit 250 according to the present invention. REFCLK control circuit 250 includes a three-input NOR-gate 320, a NAND-gate 322, a NAND-gate 324, a NAND-gate 326, a cascade of five inverters 328, an inverter 330, and a cascade of twelve inverters 332. Because phase detector system 232 provides asynchronous control of the UP and DOWN outputs of sequential PFD 242, the inverter cascades function to introduce delays into the logic to thereby mitigate certain "race-through" conditions. Such race-through conditions are implementation specific, and thus, will vary depending upon the specific logic implementation utilized.

With ZCTRL 294 at a LO state, the output of NOR-gate 320 depends on the state of UPCTRL 290 and DNCTRL 292. If both UPCTRL 290 and DNCTRL 292 are LO, the output of NOR-gate 320 is HI. Also with UPCTRL 290 LO, the output of NAND-gate 326 is HI, which causes the output of NAND-gate 324 to depend on the state of the output of NAND-gate 322. However, with the output of NOR-gate 320 HI, the output of NAND-gate 322 depends on the state of REFCLK 264. Thus, the state of the output of NAND-gate 324, and thus the state of REFCLK latch signal 276, depends on the state of REFCLK 264. This scenario corresponds to row 310 of truth table 300 of FIG. 3B.

With ZCTRL 294 at a LO state and UPCTRL 290 at a HI state, the output of NOR-gate 320 is LO regardless of the state of DNCTRL 292. With the output of NOR-gate 320 LO, the output of NAND-gate 322 is HI regardless of the state of REFCLK 264. With the output of NAND-gate 322 HI, the output of NAND-gate 324 depends on the state of the output of NAND-gate 326. However, with ZCTRL 294 LO, $\overline{\text{ZCTRL}}$ 294' is necessarily HI, causing the output of NAND-gate 326 to depend on the state of UPCTRL 290. Thus, the state of the output of NAND-gate 324, and thus the state of REFCLK latch signal 276 depends on the state of UPCTRL 290. This scenario corresponds to rows 304 and 308 of truth table 300 of FIG. 3B.

With both ZCTRL 294 and UPCTRL 292 at a LO state and DNCTRL 292 at a HI state, the output of NAND-gate 320 is LO. With the output of NOR-gate 320 LO, the output of NAND-gate 322 is HI regardless of the state of REFCLK 264. With the output of NAND-gate 322 HI, the output of NAND-gate 324 depends on the state of the output pf NAND gate 326. However, with ZCTRL 294 LO, $\overline{\text{ZCTRL}}$ 294' is necessarily HI, causing the output of NAND-gate 326 to depend on the state of UPCTRL 290. Thus, the state of the output of NAND-gate 324, and thus the state of REFCLK latch signal 276 depends on the state of UPCTRL 290. This scenario corresponds to row 306 of truth table 300 of FIG. 3B.

FIG. 4B is a schematic diagram illustrating one exemplary embodiment of divided clock control circuit 252 according to the present invention. DIVCLK control circuit 252 includes a three-input NOR-gate 420, a NAND-gate 422, a NAND-gate 424, a NAND-gate 426, a cascade of five inverters 428, an inverter 430, and a cascade of twelve inverters 432. As with REFCLK control circuit 250, because phase detector system 232 provides asynchronous control of the UP and DOWN outputs of sequential PFD 242, the inverter cascades function to introduce delays into the logic to thereby mitigate certain "race-through" conditions. Such race-through conditions are implementation specific, and thus, will vary depending the specific logic implementation utilized. Because DIVCLK control circuit 252 is substantially the same as REFCLK control circuit 250, it operates in a fashion similar to that described above for REFCLK control circuit to provide the states as indicated by rows 304, 306, 308, and 310 of truth table 300 of FIG. 3B.

FIG. 4C is a schematic diagram illustrating one exemplary embodiment of latch reset control circuit 254 according to the present invention. Latch reset control circuit 254 includes NAND-gate 450, OR-gate 452, inverter 454, and NAND-gate 456. Latch reset control circuit receives $\overline{\text{UPCTRL}}$ 290' and $\overline{\text{DNCTRL}}$ 292' respectively from REFCLK control circuit 250 and DIVCLK control circuit 252 as illustrated by FIGS. 4A and 4B above.

With ZCTRL 294 at a HI state, $\overline{\text{ZCTRL}}$ 294' is necessarily at a LO state, causing the output of NAND-gate 456 to be set HI regardless of the states of $\overline{\text{UPCTRL}}$ 290', $\overline{\text{DNCTRL}}$ 292', and latch state signal 274. With the output of NAND-gate 456 set HI, and thus RESET signal 280 set HI, the Q outputs of both reference latch 244 and feedback latch 246 as asserted LO regardless of the states of REFCLK 264, DIVCLK 270, UPCTRL 290, and DNCTRL 292. This scenario corresponds to row 302 of truth table 300 of FIG. 3B.

With $\overline{\text{ZCTRL}}$ 294' at a HI state, the output of NAND-gate 456 depends on the state of the output of OR-gate 452. If both $\overline{\text{UPCTRL}}$ 290' and $\overline{\text{DNCTRL}}$ 292' are HI, the output of NAND-gate 450 is LO. With the output of NAND-gate 450 LO, the output of OR-gate 452, and thus the state of RESET signal 280, depend on the state of latch state signal 274. This scenario corresponds to row 310 of truth table 300 of FIG. 3B.

With $\overline{\text{ZCTRL}}$ 294' at a HI state, the output of NAND-gate 456 depends on the state of the output of OR-gate 452. If either or both $\overline{\text{UPCTRL}}$ 290' and $\overline{\text{DNCTRL}}$ 292' are LO, the output of OR-gate 452 is HI regardless of the state of latch state signal 274, causing the state of the output of NAND-gate 456, and thus the state of RESET signal 280, to be set LO. This scenario corresponds to rows 304, 306, and 308 of truth table 300 of FIG. 3B.

In summary, by asynchronously controlling, or overriding, the states of the UP signal 282 and DOWN signal 286, phase detector system 232 enables testing and self-calibration of a phase-locked loop in which it is employed, such as PLL 30. Additionally, because the states of the UP and DOWN signals 282 and 286 are controlled asynchronously, special timing requirements as to when input signal 272 can be initiated with respect to REFCLK 264 are not necessary, other than simple time delay elements. Furthermore, asynchronous control circuit 240 can eliminate an inherent jitter source in present in some sequential phase-frequency detector configurations by stopping rising clock edges from feeding into latch inputs while an associated reset signal is asserted.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A phase-locked loop (PLL) comprising:
   a charge-pump loop filter configured to provide a control voltage having a voltage lever based on a state of a first charge-pump (CP) control signal and on a state of a second CP control signal;
   a phase detector system configured to receive a first clock having a state, a second clock having a state, and an input signal defining a plurality of states including a first state and a second state, and configured to provide the first CP control signal and the second CP control signal each having a state based on the states of and on a phase difference between the first and second clocks when the input signal has the first state, and to provide the first CP control signal and second CP control signal each having a state asynchronously controlled by the input signal when the input signal has the second state;
   wherein the phase detector system further comprises:
   a clock control circuit configured to provide a first output signal having a state substantially equal to the state of the first clock and a second output signal having a state substantially equal to the state of the second clock when the input signal has the first state, to provide the first and second output signals having a state asynchronously controlled by the input signal when the input signal has the second state, and to provide a third output signal having a state based on the first and second CP control signals when the input signal has the first state and a state asynchronously controlled by the input signal when the input signal has the second state; and a sequential phase-frequency detector (PFD) configured to provide the first CP control signal having a state based on the states of the first and/or third output signals and the second CP control signal having a state based on the states of the second and/or third output signals.

2. The PLL of claim 1, wherein the clock control circuit comprises a logic circuit configured to minimize propagation delays when the input signal has the first state, and including delay elements configured to prevent phase detector system race-through conditions when the input signal has the second state.

3. The PLL of claim 2, wherein the input signal comprises a first input signal, a second input signal, and a third input signal, each having a first and a second state.

4. The PLL of claim 3, wherein the clock control circuit further comprises:
a reference logic circuit configured to receive the first clock and the first, second, and third input signals, to provide the first output signal having a state equal to the state of the first clock when the first, second, and third input signals each have the first state, to provide the first output signal having a state equal to the state of the first input signal when the first input signal has the second state and the second and third input signals have the first state, and to provide the first output signal having a state equal to the state of the first input signal when the first and third input signals have the first state and the second input signal has the second state.

5. The PLL of claim 3, wherein the clock control circuit further comprises:
a feedback logic circuit configured to receive the second clock and the first, second, and third input signals, to provide the second output signal having a state equal to the state of the second clock when the first, second, and third input signals each have the first state; to provide the second output signal having a state equal to the state of the second input signal when the second input signal has the second state and the first and third input signals have the first state, and to provide the second output signal having a state equal to the state of the second input signal when the second and third input signals have the first state and the first input signal has the second state.

6. The PLL of claim 3, wherein the clock control circuit further comprises:
a reset logic circuit configured to receive an inverse of each of the first, second, and third input signals, to receive a CP status signal having a state based on the states of the first and second CP control signals, to provide a reset signal having a state substantially equal to the state of the status signal when the first, second, and third input signals each have the first state, to provide the reset signal having a state substantially equal to the state of the third input signal when the third input signal has the second state, and to provide the reset signal having a state substantially equal to the state of the third input signal when the third input signal has the first state and either the first input signal and/or the second input signal have the second state.

7. The PLL of claim 2, wherein the sequential phase-frequency detector further comprises:
a first D-latch configured to receive the first output signal at a clock input and to provide the first CP control signal at a Q-output;

a second D-latch configured to receive the second output signal at a clock input and to provide the first CP control signal at a Q-output; and
an AND-gate configured to receive the first and second CP control signals at a pair of input terminals and to provide a latch reset signal having a state based on the states of the first and second CP control signals.

8. The PLL of claim 7, wherein the state of the third output signal is substantially equal to the state of latch reset signal when input signal has the first state and a state asynchronously controlled by the input signal when the input signal has the second state.

9. A phase detector system for a phase-locked loop (PLL) including a charge-pump loop filter configured to provide a control voltage having a voltage level based on a state of a first charge-pump (CP) control signal and on a state of a second CP control signal, the phase detector system comprising:
a clock control circuit configured to receive a first clock having a state, a second clock having a state, and an input signal defining a plurality of states, to provide a first output signal having a state substantially equal to the state of the first clock and a second output signal having a state substantially equal to the state of the second clock when the input signal has the first state, to provide the first and second output signals having a state asynchronously controlled by the input signal when the input signal has the second state, and to provide a third output signal having a state based on the first and second CP control signals when the input signal has the first state and a state asynchronously controlled by the input signal when the input signal has the second state; and
a sequential phase-frequency detector (PFD) configured to provide the first CP control signal having a state based on the states of the first and/or third output signals and the second CP control signal having a state based on the states of the second and/or third output signals.

10. The PLL of claim 9, wherein the first clock comprises a reference clock and the second clock comprises a feedback clock.

11. The PLL of claim 9, wherein the clock control circuit comprises a logic circuit configured to minimize propagation delays when the input signal has the first state, and including delay elements configured to prevent phase detector system race-through conditions when the input signal has the second state.

12. The PLL of claim 11, wherein the input signal comprises a first input signal, a second input signal, and a third input signal, each having a first and a second state.

13. The PLL of claim 12, wherein the clock control circuit further comprises:
a reference logic circuit configured to receive the first clock and the first, second, and third input signals, to provide the first output signal having a state equal to the state of the first clock when the first, second, and third input signals each have the first state, to provide the first output signal having a state equal to the state of the first input signal when the first input signal has the second state and the second and third input signals have the first state, and to provide the first output signal having a state equal to the state of the first input signal when the first and third input signals have the first state and the second input signal has the second state.

14. The PLL of claim 12, wherein the clock control circuit further comprises:

a feedback logic circuit configured to receive the second clock and the first, second, and third input signals, to provide the second output signal having a state equal to the state of the second clock when the first, second, and third input signals each have the first state; to provide the second output signal having a state equal to the state of the second input signal when the second input signal has the second state and the first and third input signals have the first state, and to provide the second output signal having a state equal to the state of the second input signal when the second and third input signals have the first state and the first input signal has the second state.

15. The PLL of claim 12, wherein the clock control circuit further comprises:
   a reset logic circuit configured to receive an inverse of each of the first, second, and third input signals, to receive a CP status signal having a state based on the states of the first and second CP control signals, to provide a reset signal having a state substantially equal to the state of the status signal when the first, second, and third input signals each have the first state, to provide the reset signal having a state substantially equal to the state of the third input signal when the third input signal has the second state, and to provide the reset signal having a state substantially equal to the state of the third input signal when the third input signal has the first state and either the first input signal and/or the second input signal have the second state.

16. The PLL of claim 11, wherein the sequential phase-frequency detector further comprises:
   a first D-latch configured to receive the first output signal at a clock input and to provide the first CP control signal at a Q-output;
   a second D-latch configured to receive the second output signal at a clock input and to provide the first CP control signal at a Q-output; and
   an AND-gate configured to receive the first and second CP control signals at a pair of input terminals and to provide a latch reset signal having a state based on the states of the first and second CP control signals.

17. The PLL of claim 16, wherein the state of the third output signal is substantially equal to the state of latch reset signal when input signal has the first state and a state asynchronously controlled by the input signal when the input signal has the second state.

* * * * *

UNITED STATES PATENT AND TRADEMARK OFFICE
CERTIFICATE OF CORRECTION

PATENT NO. : 7,274,764 B2
APPLICATION NO. : 10/718206
DATED : September 25, 2007
INVENTOR(S) : Alvin Loke Page 1 of 1

It is certified that error appears in the above-identified patent and that said Letters Patent is hereby corrected as shown below:

Col. 1 Line 2 delete "Ltd," and insert -- Ltd., --, therefor.

Col. 10 Line 41 In Claim 1, delete "lever" and insert -- level --, therefor.

Signed and Sealed this

Twenty-fourth Day of February, 2009

JOHN DOLL
*Acting Director of the United States Patent and Trademark Office*